United States Patent [19]

Cuomo et al.

[11] 4,231,816

[45] Nov. 4, 1980

[54] AMORPHOUS METALLIC AND NITROGEN CONTAINING ALLOY FILMS

[75] Inventors: Jerome J. Cuomo, Lincolndale; Amitava Gangulee, Croton-on-Hudson; John Kobliska, Mount Kisco, all of N.Y.

[73] Assignee: International Business Machines Corporation, Armonk, N.Y.

[21] Appl. No.: 866,115

[22] Filed: Dec. 30, 1977

[51] Int. Cl.$^3$ ............................................. C04B 35/00
[52] U.S. Cl. ................................ 148/31.55; 75/123 B; 75/170; 148/31.57; 428/450
[58] Field of Search ............ 75/123 B, 123 D, 123 K, 75/123 L, 126 A, 126 H, 126 P, 126 J, 126 K, 126 Q, 128 R, 128 B, 128 C, 128 D, 128 P, 128 F, 128 N, 134 F, 134 S, 134 P, 170; 148/31.55, 31.57; 204/192 C, 192 M; 428/450

[56] References Cited

U.S. PATENT DOCUMENTS

| | | | |
|---|---|---|---|
| 3,427,154 | 2/1969 | Mader et al. | 75/122 |
| 3,856,513 | 12/1974 | Chen et al. | 75/122 |
| 3,965,463 | 6/1976 | Chaudhari et al. | 365/10 |
| 4,002,546 | 1/1977 | Shirahata et al. | 204/192 M |
| 4,030,892 | 6/1977 | Mendelsohn et al. | 75/123 K |
| 4,038,073 | 7/1977 | O'Handley et al. | 148/31.55 |
| 4,126,287 | 11/1978 | Mendelsohn et al. | 75/123 K |

OTHER PUBLICATIONS

"New Non-Magnetostrictive Metallic Glasses" IEEE Transactions on Magnetics, vol. MAG-12, No. 6, pp. 942-944 (Nov. 1976), O'Handley et al.

"Incorporation of Rare Gases in Sputtered Amorphous Metal Films," J. of Vaccuum Science and Technology 14, No. 1, pp. 152-157, 156 (1977), Cuomo et al.

"Magnetic Properties to $TM_{80}P_{20}$ Glasses," O'Handley et al., Journal of Applied Physics, vol. 48, No. 5, May 1977, p. 2095.

"Ferromagnetic Properties of Some New Metallic Glass," O'Handley et al., Applied Physics Letters, vol. 29, No. 6, Sep. 15, 1976, pp. 330-332.

"Magnetrostruction of Ferromagnetic Metallic Glass," O'Handley, Solid State Communications, vol. 21, 1977 pp. 1119-1122, Allied Chemical, Materials Research Report, Nov. 1975.

*Primary Examiner*—L. Dewayne Rutledge
*Assistant Examiner*—John P. Sheehan
*Attorney, Agent, or Firm*—Graham S. Jones, II

[57] ABSTRACT

These amorphous metal-alloy films include nitrogen, greater than about one atomic percent at least one transition metal selected from Cr, Fe, Co and Ni with at least one element forming an amorphous alloy therewith, selected from the "glass forming" elements, i.e., B, Si, Al, C and P. The alloys can be formed by deposition in a vacuum chamber. When films are sputtered, the target is composed of the above alloy elements with at least one element selected from each of the transition metal and glass forming element groups. Sputtering occurs in an atmosphere above about 2% vol. $N_2$ gas mixed with an inert gas, e.g., Ar. Alloys produced include N, i.e., (Co-Fe-B)N and (Fe-B)N. Above about 2 atomic % N in the film, films have lower values of saturation magnetization $4\pi M_s$. Above a 2% vol. $N_2$ gas in the plasma, electrical resistivity increases. Over 0.5% vol. $N_2$ gas in the plasma, the film's effective perpendicular anisotropy field $H_k^*$ increases. For (Co-Fe-B)N, the anisotropy direction moves from in plane to perpendicular above 2% vol. $N_2$ plasmas. For (Fe-B)N, $H_k^*$ increases with $N_2$ up to 10% vol. $N_2$ plasma. The N% in a film varies linearly with the log of $N_2$% vol. Films show markedly improved adhesion, corrosion resistance and hardness. Magnetic thermal stability increases with $N_2$ above about 5% vol. $N_2$ in a plasma. Structural and magnetic properties are stable for annealing up to 400° C.

12 Claims, 4 Drawing Figures

AMORPHOUS METALLIC AND NITROGEN CONTAINING ALLOY FILMS

BACKGROUND OF THE INVENTION

1. Field of the Invention

This invention relates to amorphous metallic films, and more particularly to amorphous metal films containing significant amounts of nitrogen.

2. Description of the Prior Art

U.S. Pat. No. 4,002,546 entitled "Method for Producing a Magnetic Recording Medium" of Shirahata et al describes ion plating of a Co-Si, Co-Ni-Si, Co-Fe-Si, or Co-Ni-Fe-Si magnetic alloy onto a support such as a plastic, a glass or a nonmagnetic metal. The ion plating is performed in a glow discharge of an "inert gas" such as nitrogen, helium, neon, argon, krypton, xenon, radon, mixtures thereof, etc. The gases used in the examples given were helium and argon, but not nitrogen. It is stated that ion plating of the above materials provides magnetic recording media having good adhesion to the support with excellent magnetic properties. There is no mention of the formation of an alloy including any of the "inert gases" such as nitrogen or any special effect of the use of nitrogen. There is no example or data in the patent which shows that nitrogen gas was actually used. No effect upon resistivity, magnetization ($4\pi M_s$), effective anisotropy field ($H_k^*$) or anisotrophy energy $K_u$, corrosion resistance, thermal stability or mechanical hardness is mentioned. Where the sputtering gas was helium in Example I, traces of O, Ar, N and C were found, but that is not relevant. Since nitrogen is normally considered to be a reactive gas, its inclusion as an inert gas may have been an inadvertent error.

U.S. Pat. No. 3,856,513 of Chen et al makes amorphous Co-Fe-B by ejecting a molten stream onto rollers or by evaporation of $Ni_{75}P_{16}B_6S_3$ onto a copper substrate. Use of nitrogen was not mentioned.

O'Handley et al in "New Non-Magnetostrictive Metallic Glasses," IEEE Transactions on Magnetics, Vol. MAG-12, No. 6, pp. 942-944 (November 1976) describes a bulk metallic glass alloy of $Co_{74}Fe_6B_{20}$ with a high value of $4\pi M_s$ of 11.8 KG and a low value of $H_c$ of 0.035 Oe which diverge from the objects and advantages of this invention.

U.S. Pat. No. 4,038,073 of O'Handley et al entitled "Near-Zero Magnetostrictive Glassy Metal Alloys with High Saturation Induction" describes $(Co_xFe_{1-x})_aF_bC_c$ compounds which were not deposited by sputtering, ion plating, evaporation or the like. No mention of $N_2$ was made.

U.S. Pat. No. 3,965,463 of Chaudhari et al for "Apparatus Using Amorphous Magnetic Compositions," commonly assigned, describes sputtering of magnetic amorphous materials such as Gd-Fe and Gd-Co in argon in the presence of small amounts of $N_2$ gas, about 1 volume percent, as a way to increase or decrease the magnetization, $4\pi M_s$, by changing the exchange interaction between the constituents of the composition to a higher or lower magnetization, depending upon the location on the magnetization versus composition curve. It also suggests that coercivity $H_c$ can be changed by adding $O_2$ or $N_2$ as dopants to adjust grain size (although amorphous materials generally do not possess granularity), since coercivity is dependent on grain size. No suggestion is made that there is an advantage to adding more than 1 or 2 percent of $N_2$ into the plasma for improving qualities such as adhesion, corrosion, mechanical hardness, and $H_k^*$ or even for the purpose of increasing a parameter such as resistivity and decreasing magnetization ($4\pi M_s$). Furthermore, the patent does not mention any elements such as B, Si, Al, C, and P which are remote from Gd on the periodic chart and which are unlike Gd because they are nonmagnetic and possess atomic radii of about 0.91-1.43 Å whereas Gd possesses an enormous atomic radius of 1.79 Å. The magnetic metals Fe, Co, and Ni all have atomic radii of from 1.24 to 1.26 Å, and nitrogen has an atomic radius of 0.92 Å. Since the radius of nitrogen is half that of gadolinium and since it is closer in size to the radii of the elements forming the amorphous compounds of this invention, it can be seen that $N_2$ gas is unlikely to have the same effect upon GdFe as on CoFeB because it will fit into the structure similarly to boron. The patent mentions anisotropy $K_u$ as varying with film thickness and deposition rate and film composition, but no mention is made that nitrogen content affects $H_k^*$.

Cuomo et al "Incorporation of Rare Gases in Sputtered Amorphous Metal Films," Journal of Vacuum Science and Technology 14 No. 1, pp. 152-157, 156 (1977) states as follows: "For example, the large argon concentration in tungsten sputtered in a $N_2Ar$ mixture[10] and tungsten and tantalum in argon[4] is possibly due to the W and Ta being in the amorphous state. Although the authors do not state the structure of their materials, it is known that these transition metals are readily stabilized as amorphous phases[16] and would therefore readily accomodate the inert gas constituent."

U.S. Pat. No. 3,427,154 of Mader points out that a criterion of an amorphous alloy is that there should be sufficient difference between the component atomic radii to inhibit transformation by diffusion or segregation. For component atoms A and B with radii $r_A$ and $r_B$, the size factor is defined as:

$$\frac{|r_B - r_A| \times 100\%}{\frac{1}{2}(r_A + r_B)}$$

The results are as follows:

| Alloy | $R_B$ (Å) | $R_A$ (Å) | Percentage |
|---|---|---|---|
| GdFe | 1.79 | 1.26 | 34% |
| GdN | 1.79 | 0.92 | 62% |
| FeN | 1.26 | 0.92 | 31% |
| FeB | 1.26 | 0.98 | 25% |
| BN | 0.98 | 0.92 | 6% |
| SiN | 1.32 | 0.92 | 36% |

Obviously Gd is far more distinct in size from Fe and N than are B and Si, so based upon the above differences one would not consider Gd and the elements B, C, P, and Si to be closely related either in terms of size or magnetic characteristics.

SUMMARY OF THE INVENTION

In accordance with this invention, an amorphous metallic film is composed of an alloy of nitrogen with at least one transition metal selected from the group including Cr, Fe, Co, and Ni and at least one element selected from the group including B, Si, Al, C, and P, wherein the nitrogen content of the alloy is greater than about 1 atomic percent. Further in accordance with this invention, preferably the above film has been sputtered in a chamber containing at least about 2 volume percent of $N_2$ in the plasma.

Still further, preferably a film in accordance with this invention comprises an alloy of (Co-Fe-B)N, which preferably comprises $(Co_{78}Fe_5B_{17})_xN_{100-x}$ where $100-x$ is at least about 1% of x.

In another aspect of this invention, the film comprises an alloy of Fe-B-N, which preferably comprises an alloy of $(Fe_{80}B_{20})_xN_{100-x}$ where $100-x$ is at least about 1% of x.

In another aspect of this invention, the film possesses a high degree of adhesion exceeding the pull test when the film contains on the order of 26 atomic percent of nitrogen.

The film also possesses a high degree of adhesion exceeding the peeling test with adhesive tape when the film contains about 14 to 26 atomic percent of nitrogen.

The film possesses a hardness having an increase of 1 grade on the Moh's scale above the hardness of a comparable alloy excluding any nitrogen, when the film includes on the order of 20 atomic percent of nitrogen.

The film has a high degree of magnetic-thermal stability up to 400° C. when the film includes above about 9 atomic percent of nitrogen.

The film has excellent corrosion resistance when it contains greater than about 10 atomic percent of an element selected from the group consisting of chromium and nitrogen.

The film has a substantial perpendicular anisotrophy when it includes more than about 1 atomic percent of nitrogen in the film.

The film can include an alloy of one or more elements selected from the group of magnetic transition metals comprising Fe, Ni and Co in substantial quantities sufficient to have a high magnetization in the absence of nitrogen in the film but which has substantially no magnetization when the atomic percent of nitrogen in the film is on the order of 20.

The film has its resistivity substantially increased above an atomic nitrogen content of about 5 percent.

DETAILED DESCRIPTION OF THE PREFERRED EMBODIMENT

Transition metal alloys with "glass forming" elements sputtered in a nitrogen atmosphere provide amorphous films which provide excellent adhesion to substrates and excellent mechanical hardness. Such films are particularly suitable to use in products made with laminated films. Such laminated films include alternate layers with alternate strong and weak magnetic characteristics. Films composed of magnetic alloys excluding nitrogen are used for their strong magnetic characteristics and nitrogen rich alloys otherwise of the same chemical composition can be used for their reduced magnetic activity or magnetic inactivity, increased electrical sensitivity, adhesion and mechanical hardness. Such laminated films are adapted for use in products such as magnetic recording heads, with low Barkhausen noise and low coercivity provided by employing many layers of laminations, e.g., 25 layers. They can provide mechanical and chemical protective masks for thin film devices, and are useful as coating materials for surgical instruments and razor blades.

Figure 1:
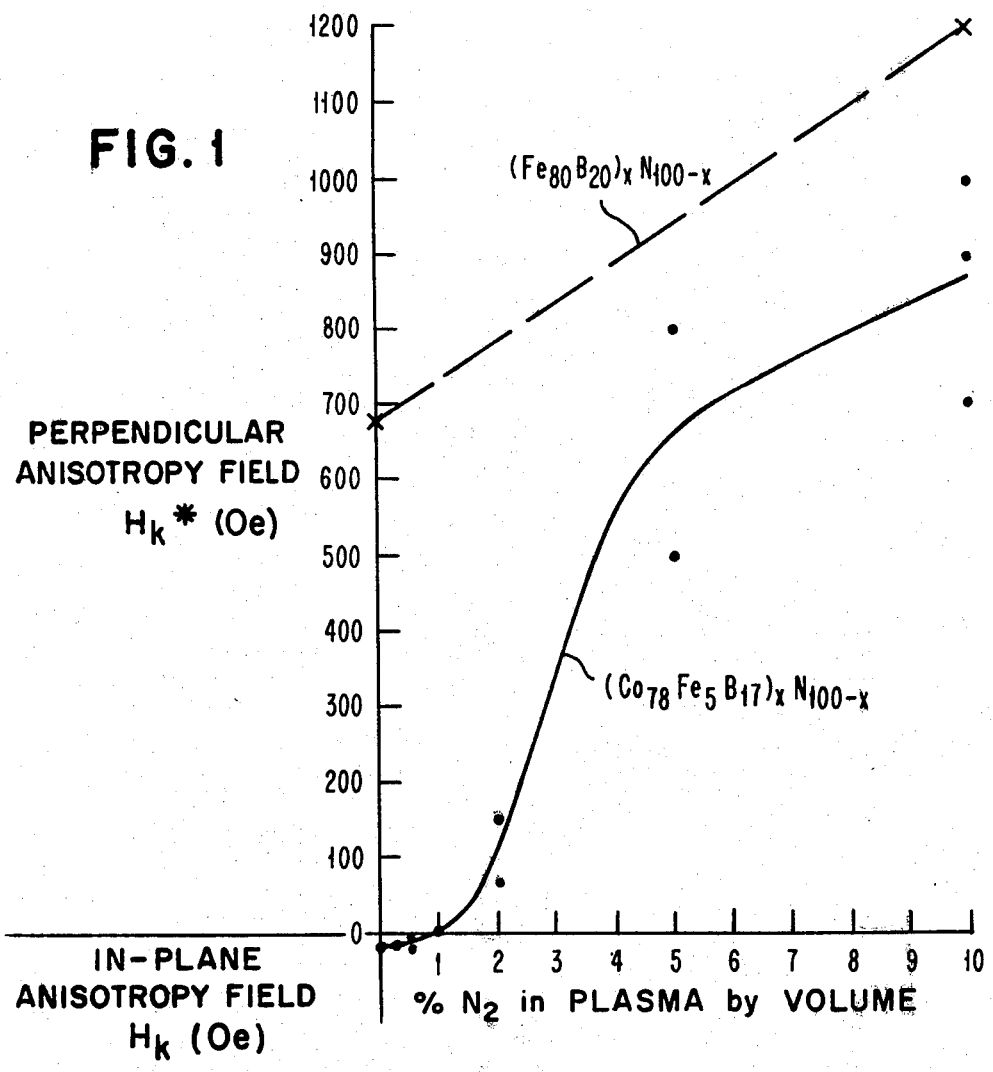
FIG. 1 shows a graph of the effective perpendicular anisotropy field $H_k^*$ and in the plane anisotropy field $H_k$ as a function of the volume percentage of $N_2$ gas in the plasma for two different alloy systems.
Figure 3:
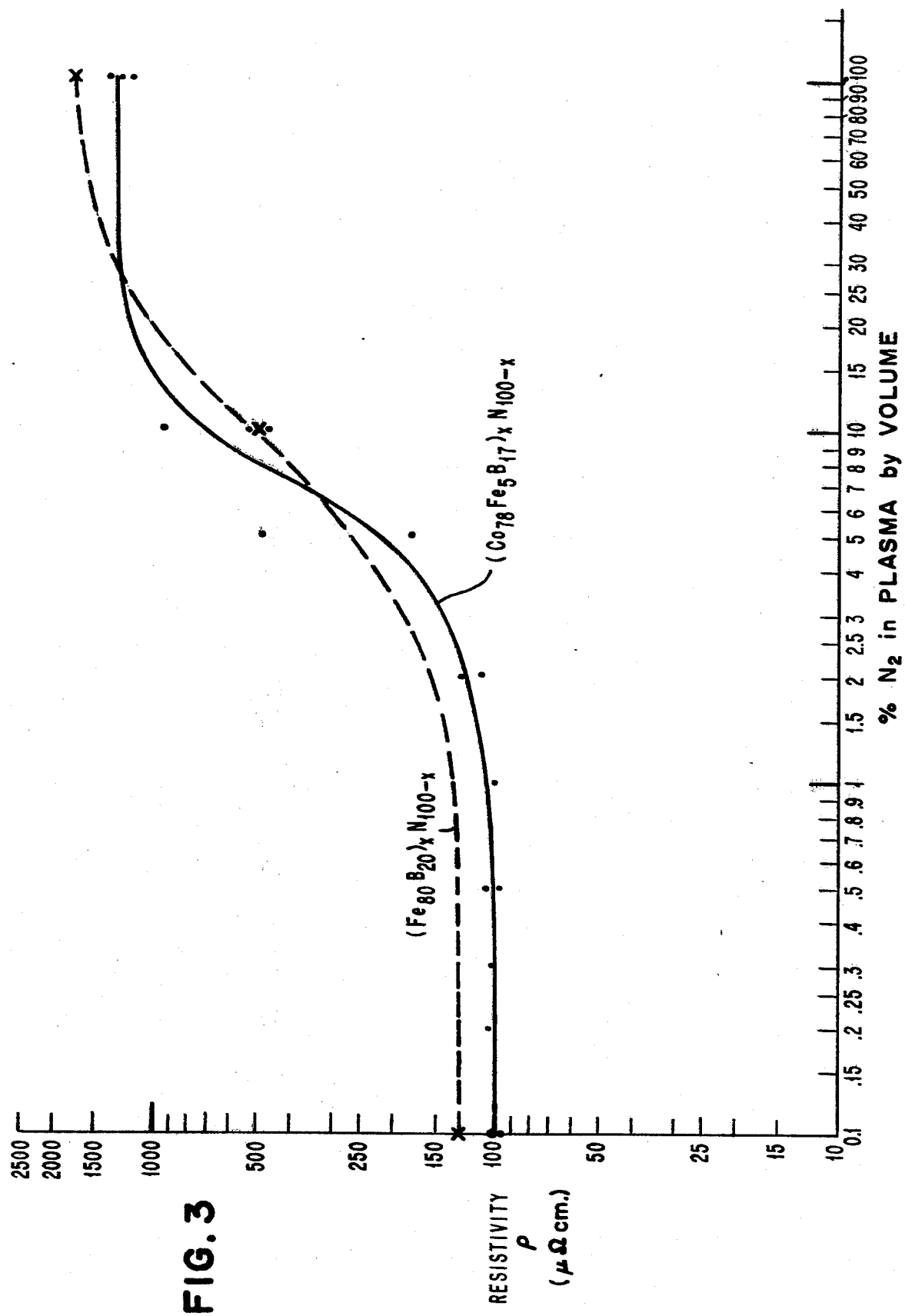
FIG. 3 shows a graph of resistivity as a function of the volume percentage of $N_2$ gas in the plasma.
Figure 4:
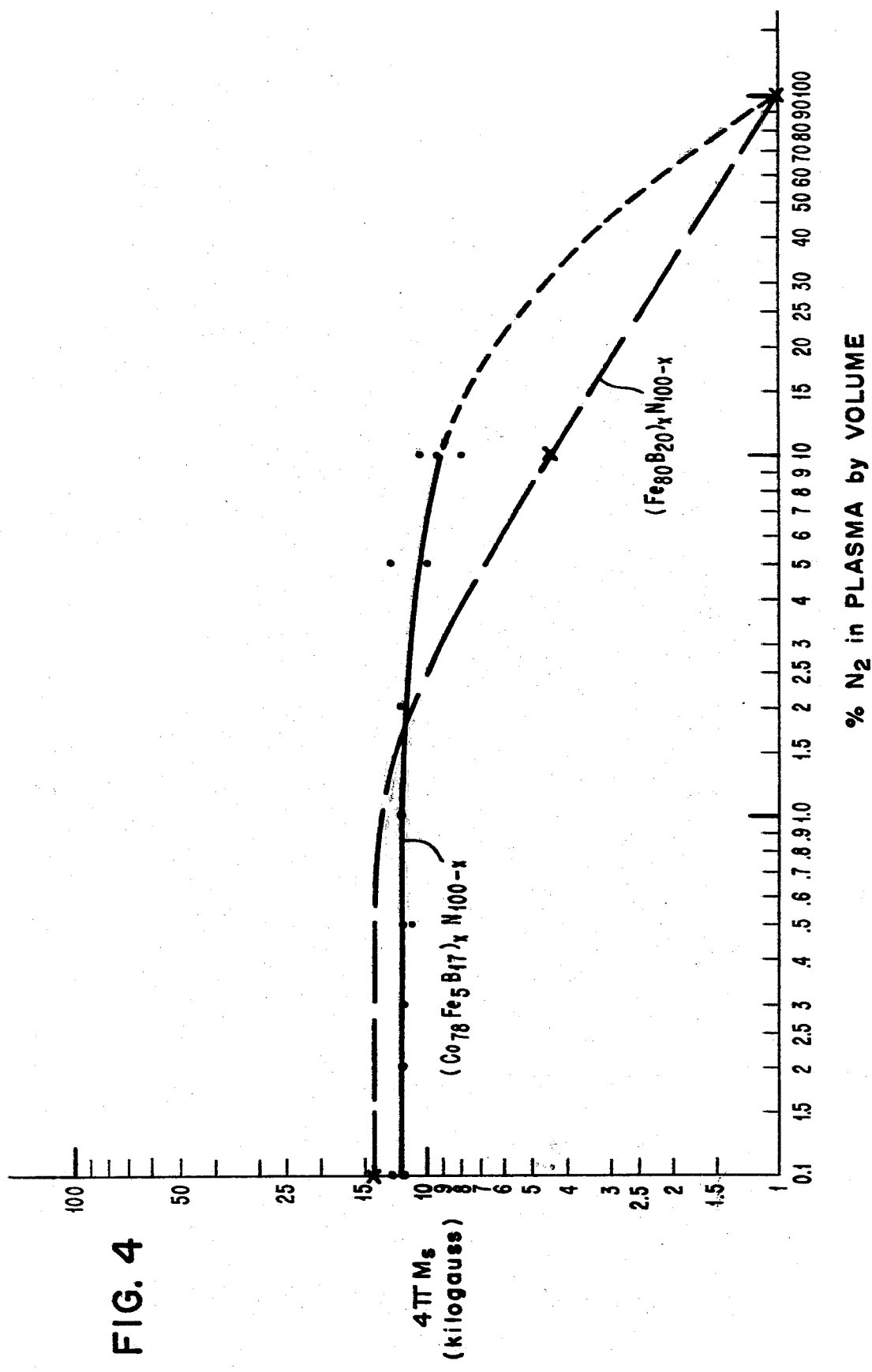
FIG. 4 shows a graph of magnetization ($4\pi M_s$) as a function of the volume percentage of $N_2$ gas in the plasma.

The sputtering target used may include an alloy of one or more transition metals selected from Cr, Fe, Co, and Ni plus one or more elements selected from B, Si, Al, C, and P. The volume percentage of $N_2$ gas in the sputtering chamber will determine several characteristics of the material as illustrated in FIGS. 1, 3 and 4 as well as Examples I-XXII below. These films should include more than about 1 atomic percent of nitrogen in the film for a 2 volume percent of $N_2$ gas in the plasma. For certain values of nitrogen volume percent in the plasma, the values of $H_k^*$, resistivity and magnetization change significantly. For example, the values begin to change at nitrogen contents as follows: Above about 1 volume percent for $H_k^*$ in FIG. 1, 3-6% for resistivity in FIG. 2 and about 10% for magnetization in FIG. 4, although a very slight change begins to be noticeable for volume percentage as low as about 1% for all three curves.

Effective Anisotropy Field $H_k^*$

Referring again to FIG. 1, there are two curves shown with both curves primarily representing the variation in the effective perpendicular anisotropy field $H_k^*$ in a direction normal to the plane of the thin film as a function of the volume percentage of $N_2$ gas in the plasma. In addition, below the origin, the in plane anisotropy field $H_k$ values are shown for very low percentages of $N_2$ gas for the lower curve only. The lower curve shows many points for a (Co-Fe-B)N alloy. The curve rises rapidly at 1-2 volume percent corresponding to about 1 atomic percent of nitrogen in the film and rises less rapidly above about 5 volume percent of $N_2$ gas, although the values of $H_k^*$ increase up to 10 volume percent of $N_2$ gas. Up to 1 volume percent of $N_2$ gas, the anisotropy direction is in the plane of the film, but it becomes positive or perpendicular to the plane above 1 volume percent of $N_2$ gas. There is a dotted line curve drawn for the two points at 0 and 10 volume percent of nitrogen for an Fe-B-N alloy which roughly parallels the other curve with quite a bit higher range of values of $H_k^*$. It should be noted from Examples XVII, XVIII, XIX, and XXII below that the value of $H_k^*$ reduces to 0 at 100 volume percent of $N_2$ in the sputtering gas, at which point the magnetic properties of the material are destroyed, as is further confirmed by FIG. 4 as is described below. The specific alloys used are shown with the atomic percentage of nitrogen represented by $100-x$ where the atomic percentage of other elements in the alloy is x.

Nitrogen Content of Film

Figure 2:
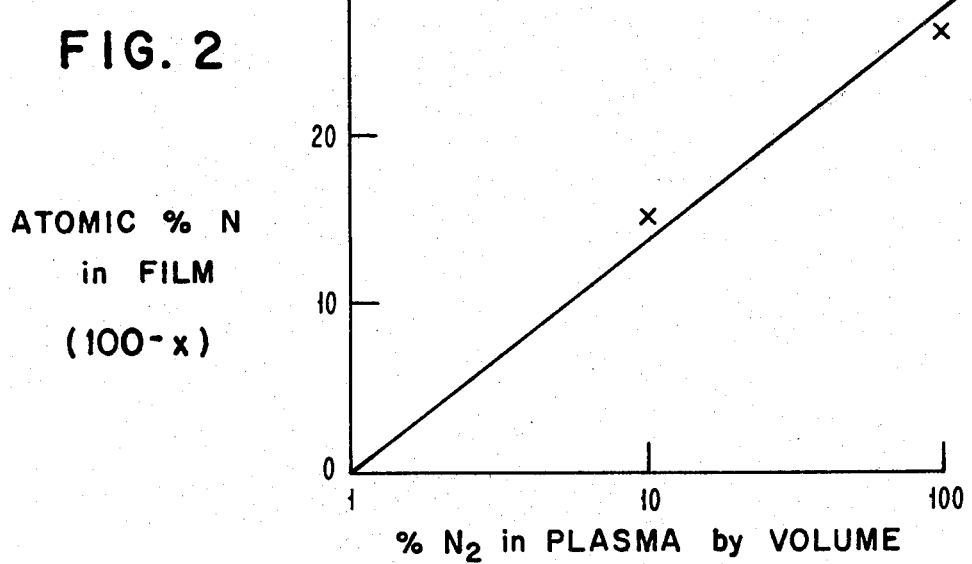
FIG. 2 shows a graph of the atomic percentage of nitrogen in a film as a function of the volume percentage of $N_2$ gas in the plasma.

FIG. 2 shows a curve with a linear vertical axis of atomic percent of nitrogen in the film versus a horizontal logarithmic axis of the volume percentage of $N_2$ gas in the plasma which appears to make it clear based on the limited data that the atomic percentage of nitrogen in the film varies as a linear function of the logarithm of the volume percentage of $N_2$ gas in the plasma. Thus, the rate of increase in nitrogen content in the film with nitrogen in the gas is far less than linear. There is about 14 atomic percent of nitrogen in the film for 10 volume percent of nitrogen in the plasma and about 26 atomic percent of nitrogen in the film for 100 volume percent of nitrogen in the plasma.

Resistivity

FIG. 3 shows that the introduction of N into both alloys Fe-B and Co-Fe-B leads to an increase of resistivity reaching about 2,000 $\mu\Omega$cm. Resistivity reaches a rapid rate of increase at about 3-6 volume percent of $N_2$ gas in the plasma (about 5-7 atomic percent of nitrogen in the film). Resistivity begins to increase about 1 volume percent of $N_2$ gas, and levels off about 10 volume percent of $N_2$ gas.

Magnetization

FIG. 4 shows that magnetization, $4\pi M_s$, declines as a function of volume percentage of $N_2$ gas with the decline starting about 1-4% of $N_2$ gas, being clearly observable by 10% of $N_2$ gas, and reaching zero by 100% of $N_2$ gas, at which point the nitrogen in the film has apparently made the alloys magnetically inactive in a way which is suitable for lamination of magnetic and nonmagnetic layers, as described above.

Adhesion

The films have been tested for adhesion of the films to a substrate of $SiO_2$ or oxidized silicon (i.e., 0.5 $\mu$m $SiO_2$ on Si). In the pull test, a metallic spool head about ½ inch in diameter was secured by an epoxy give to a film of $(Fe_{80}B_{20})_xN_{100-x}$ deposited on such a substrate with 100 volume percent of nitrogen in the plasma. Upon trying to pull the spool and the substrate apart, the substrate was broken but the film was not released, even then. This corresponds to about 26 atomic percent of nitrogen in the film.

A peeling test was employed using Scotch brand translucent self-adhering tape to pull upon the (Co-Fe-B)N and (Fe-B)N films with 10 and 100 volume percent of nitrogen in the plasma or 14 and 26 atomic percent of nitrogen in the films, respectively. The tape did not remove the films, although it will remove 80:20 NiFe, aluminum, Fe-Co-B and Fe-B films. Thus, addition of N to both films clearly provided a critical level of improvement in adhesion of those alloys to $SiO_2$. Adhesion data was collected by testing several samples selected from the Examples I-XXII listed below.

Hardness

The hardness of Fe-Cr-B is greater than that of Fe-B which is normally greater than Co-Fe-B, which has a Moh's scale value between 6 and 7 or Knoop hardness values between 560 and 710. When a large percentage of nitrogen is added, (Co-Fe-B)N is between about 7 and 8 on the Moh's scale or between 710 and 1250 on the Knoop hardness scale for a very considerable increase in hardness. (Fe-Cr-B)N is harder than Fe-B-N, which is harder than (Co-Fe-B)N. (Fe-Cr-B)N has a hardness near 8 (Moh's) of 1250 (Knoop). These values were determined in a rough measurement by using scratch tests. For example, steel has a hardness of 6 Mohs or 560 Knoop and Co-Fe-B scratches steel. Similarly, (Co-Fe-B)N scratches Si or garnet, and quartz or Si have a Moh's scale value of 7. In general then, hardness increased by a grade of 1 on the Moh's scale following addition of 100 volume percent of $N_2$ gas in the plasma, which corresponds to about 26 atomic percent of nitrogen in the film.

Magnetic-Thermal Stability

It has been found that the magnetic thermal stability increases above an $N_2$ gas value above about 5 volume percent in the plasma or about 9 atomic percent nitrogen in the film. However, the films are substantially not subject to change by annealing because up to 400° C. the structural and magnetic properties were unchanged. The materials were annealed with and without an external magnetic field of about 6-8 kilogauss for about one hour at 400° C. Not the slightest change was seen in run 29 Example XII (5% $N_2$ gas) and run 25 Example XV (10% $N_2$ gas).

Corrosion Resistance

When these transition metal glass films contain greater than about 10 atomic percent of Cr, they have excellent corrosion resistance. Above about 10 atomic percent of nitrogen in these alloys similar excellent corrosion resistance was observed. As nitrogen is added, the corrosion resistance increases as shown by the decreasing etch rate in acidic ferric chloride solution.

Sputtering Equipment

Sputtering equipment used was of the same variety as that shown in FIG. 1B of copending United States patent application Ser. No. 844,541 of Cuomo et al entitled "Etching by Sputtering from the Target to Form Negative Metallic Ions which Produce Etching from a Juxtaposed Substrate," commonly assigned. The equipment is operated with similar constraints also, with differences in voltages and pressures (since negative ions are not involved) and in gas content, in view of the subject matter of this invention.

Alternative Equipment

Deposition of such films can be performed with alternative equipment such as ion plating systems, employing nitrogen in the ion plating chamber. Sources can be employed with similar composition to the sputtering targets described above. Alternatively, reactive secondary ion beam deposition can be employed to prepare these materials.

Example I

| Target Content $Co_{78}Fe_5B_{17}$ Run Number 36 | Presputter | Sputter |
|---|---|---|
| Percent $N_2$: Percent Ar | 0:100 | 0:100 |
| Incident Watts (R.F.) | 90/10 | 90/5 |
| Reflected Watts | 5/1 | 5/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 0.50 | 0.50 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | 5940 | |
| Ohms/square | 2.01 | |
| $\rho$ ($\mu\Omega$ cm) | 106 | |
| Magnetization ($4\pi M_s$) | 11.3 | |
| $H_k$* | −14 | |

Example II

| Target Content Co<sub>78</sub>Fe<sub>5</sub>B<sub>17</sub> Run Number 35 | Presputter | Sputter |
|---|---|---|
| Percent N$_2$: Percent Ar | 0.1:99.9 | 0.1:99.9 |
| Incident Watts (R.F.) | 90 | 90 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 3.8 | 3.8 |
| Chamber Pressure (millitorr) | 20 | 20 |
| Cathode Diameter (cm) | 11.43 | 11.43 |
| Time (min.) | 45 | 60 |
| Temperature (°C.) | cold H$_2$O | cold H$_2$O |
| Thickness of film (Å) | 3640 | |
| Ohms/square | — | |
| $\rho$ ($\mu\Omega$ cm) | 98 | |
| Magnetization ($4\pi M_s$) | 11.6 | |
| $H_k$* | −16 | |

Example III

| Target Content Co$_{78}$Fe$_5$B$_{17}$ Run Number 37 | Presputter | Sputter |
|---|---|---|
| Percent N$_2$: Percent Ar | 0.1:99.9 | 0.1:99.9 |
| Incident Watts (R.F.) | 90/4 | 90/3 |
| Reflected Watts | 6/0 | 6/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 3.2 | 3.2 |
| Chamber Pressure (millitorr) | 20 | 20 |
| Cathode Diameter (cm) | 11.43 | 11.43 |
| Time (min.) | 30 | 60 |
| Temperature (°C.) | cold H$_2$O | cold H$_2$O |
| Thickness of film (Å) | 4850 | |
| Ohms/square | 1.84 | |
| $\rho$ ($\mu\Omega$ cm) | 98 | |
| Magnetization ($4\pi M_s$) | 12.3 | |
| $H_k$* | −15 | |

Example IV

| Target Content Co$_{78}$Fe$_5$B$_{17}$ Run Number 41 | Presputter | Sputter |
|---|---|---|
| Percent N$_2$: Percent Ar | 0.1:99.9 | 0.1:99.9 |
| Incident Watts (R.F.) | 90/3 | 90/3 |
| Reflected Watts | 2.5/0 | 2.5/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 0.5 | 0.5 |
| Chamber Pressure (millitorr) | 20 | 20 |
| Cathode Diameter (cm) | 11.43 | 11.43 |
| Time (min.) | 60 | 60 |
| Temperature (°C.) | cold H$_2$O | cold H$_2$O |
| Thickness of film (Å) | 5940 | |
| Ohms/square | 1.72 | |
| $\rho$ ($\mu\Omega$ cm) | 102 | |
| Magnetization ($4\pi M_s$) | 11.4 | |
| $H_k$* | −14 | |

Example V

| Target Content Co$_{78}$Fe$_5$B$_{17}$ Run Number 38 | Presputter | Sputter |
|---|---|---|
| Percent N$_2$: Percent Ar | 0.2:99.8 | 0.2:99.8 |
| Incident Watts (R.F.) | 90/3 | 90/3 |
| Reflected Watts | 0/0 | 0/0 |
| Cathode Voltage (D.C.) | 1000 | 1000 |
| Bias Voltage (Volts D.C.) | 50 | 50 |
| Initial Pressure chamber ($\times 10^{-7}$ Torr) | 1.5 | 1.5 |
| Chamber Pressure (millitorr) | 20 | 20 |

-continued

| Target Content Co$_{78}$Fe$_5$B$_{17}$ Run Number 38 | Presputter | Sputter |
|---|---|---|
| Cathode Diameter (cm) | 11.43 | 11.43 |
| Time (min.) | 60 | 60 |
| Temperature (°C.) | cold H$_2$O | cold H$_2$O |
| Thickness of film (Å) | 5090 | |
| Ohms/square | 1.81 | |
| $\rho$ ($\mu\Omega$ cm) | 102 | |
| Magnetization ($4\pi M_s$) | 11.8 | |
| $H_k$* | −12 | |

Example VI

| Target Content Co$_{78}$Fe$_5$B$_{17}$ Run Number 39 | Presputter | Sputter |
|---|---|---|
| Percent N$_2$: Percent Ar | 0.3:99.7 | 0.3:99.7 |
| Incident Watts (R.F.) | 90/3 | 90/3 |
| Reflected Watts | 5/0 | 5/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 0.45 | 0.45 |
| Chamber Pressure (millitorr) | 20 | 20 |
| Cathode Diameter (cm | 11.43 | 11.43 |
| Time (min.) | 60 | 60 |
| Temperature (°C.) | cold H$_2$O | cold H$_2$O |
| Thickness of film (Å) | 5340 | |
| Ohms/square | 1.67 | |
| $\rho$ ($\mu\Omega$ cm) | 101 | |
| Magnetization ($4\pi M_s$) | 11.3 | |
| $H_k$* | −15 | |

Example VII

| Target Content Co$_{78}$Fe$_5$B$_{17}$ Run Number 40 | Presputter | Sputter |
|---|---|---|
| Percent N$_2$: Percent Ar | 0.5:99.5 | 0.5:99.5 |
| Incident Watts (R.F.) | 90/3 | 90/3 |
| Reflected Watts | 7/0 | 7/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 2 | 2 |
| Chamber Pressure (millitorr) | 20 | 20 |
| Cathode Diameter (cm) | 11.43 | 11.43 |
| Time (min.) | 60 | 60 |
| Temperature (°C.) | cold H$_2$O | cold H$_2$O |
| Thickness of film (Å) | 5340 | |
| Ohms/square | 1.78 | |
| $\rho$ ($\mu\Omega$ cm) | 105 | |
| Magnetization ($4\pi M_s$) | 11.5 | |
| $H_k$* | −15 | |

Example VIII

| Target Content Co$_{78}$Fe$_5$B$_{17}$ Run Number 43 | Presputter | Sputter |
|---|---|---|
| Percent N$_2$: Percent Ar | 0.5:99.5 | 0.5:99.5 |
| Incident Watts (R.F.) | 90/3 | 90/3 |
| Reflected Watts | 5/1 | 5/1 |
| Cathode Voltage (D.C.) | 1000 | 1000 |
| Bias Voltage (Volts D.C.) | 50 | 50 |
| Initial Pressure Chamber ($\times 10^{-7}$ Torr) | 2 | 2 |
| Chamber Pressure (millitorr) | 20 | 20 |
| Cathode Diameter (cm) | 11.43 | 11.43 |
| Time (min.) | 60 | 60 |
| Temperature (°C.) | cold H$_2$O | cold H$_2$O |
| Thickness of film (Å) | 4850 | |
| Ohms/square | 1.99 | |
| $\rho$ ($\mu\Omega$ cm) | 96 | |
| Magnetization ($4\pi M_2$) | 11.1 | |
| $H_k$* | −9 | |

Example IX

| Target Content $Co_{78}Fe_5B_{17}$ Run Number 42 | Presputter | Sputter |
|---|---|---|
| Percent $N_2$: Percent Ar | 1:99 | 1:99 |
| Incident Watts (R.F.) | 90/2 | 90/2 |
| Reflected Watts | 10/0 | 10/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 1.0 | 1.0 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | 4850 | |
| Ohms/square | 2.17 | |
| $\rho$ ($\mu\Omega$ cm) | 101 | |
| Magnetization ($4\pi M_s$) | 11.8 | |
| $H_k{}^*$ | −5 | |

Example X

| Target Content $Co_{78}Fe_5B_{17}$ Run Number 28 | Presputter | Sputter |
|---|---|---|
| Percent $N_2$: Percent Ar | 2:98 | 2:98 |
| Incident Watts (R.F.) | 70 | 70 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 2.4 | 2.4 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | 3030 | |
| Ohms/square | 4.4 | |
| $\rho$ ($\mu\Omega$ cm) | 128 | |
| Magnetization ($4\pi M_s$) | 11.5 | |
| $H_k{}^*$ | +150 | |

Example XI

| Target Content $Co_{78}Fe_5B_{17}$ Run Number 44 | Presputter | Sputter |
|---|---|---|
| Percent $N_2$: Percent Ar | 2:98 | 2:98 |
| Incident Watts (R.F.) | 90/3 | 90/3 |
| Reflected Watts | 6/1 | 3/0 |
| Cathode Voltage (D.C.) | 1000 | 1000 |
| Bias Voltage (Volts D.C.) | 50 | 50 |
| Initial Pressure Chamber ($\times 10^{-7}$ Torr) | 3.8 | 3.8 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | 4240 | |
| Ohms/square | 2.50 | |
| $\rho$ ($\mu\Omega$ cm) | 110 | |
| Magnetization ($4\pi M_s$) | +70 | |

Example XII

| Target Content $Co_{78}Fe_5B_{17}$ Run Number 29 | Presputter | Sputter |
|---|---|---|
| Percent $N_2$: Percent Ar | 5:95 | 5:95 |
| Incident Watts (R.F.) | 70 | 70 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 3.2 | 3.2 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | 3640 | |
| Ohms/square | 14.96 | |
| $\rho$ ($\mu\Omega$ cm) | 481 | |
| Magnetization ($4\pi M_s$) | 10 | |
| $H_k{}^*$ | +800 | |

Example XIII

| Target Content $Co_{78}Fe_5B_{17}$ Run Number 34 | Presputter | Sputter |
|---|---|---|
| Percent $N_2$: Percent Ar | 5:95 | 5:95 |
| Incident Watts (R.F.) | 95 | 95 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 1.7 | 1.7 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | 3880 | |
| Ohms/square | — | |
| $\rho$ ($\mu\Omega$ cm) | 178 | |
| Magnetization ($4\pi M_s$) | 12.5 | |
| $H_k{}^*$ | +500 | |

Example XIV

| Target Content $Co_{78}Fe_5B_{17}$ Run Number 22 | Presputter | Sputter |
|---|---|---|
| Percent $N_2$: Percent Ar | 10:90 | 10:90 |
| Incident Watts (R.F.) | 70 | |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 3.7 | 3.7 |
| Chamber Pressure (millitorr) | 20 | 20 |
| Cathode Diameter (cm) | 10.16 | 10.16 |
| Time (min.) | 30 | 60 |
| Temperature (°C.) | cold $H_2O$ | cold $H_2O$ |
| Thickness of film (Å) | 4690 | |
| Ohms/square | 12.85 | |
| $\rho$ ($\mu\Omega$ cm) | 467 | |
| Magnetization ($4\pi M_s$) | 9.4 | |
| $H_k{}^*$ | +700 | |

Example XV

| Target Content $Co_{78}Fe_5B_{17}$ Run Number 25 | Presputter | Sputter |
|---|---|---|
| Percent $N_2$: Percent Ar | 10:90 | 10:90 |
| Incident Watts (R.F.) | 200 | 200 |
| Reflected Watts | 0 | 0 |
| Cathode Voltage (D.C.) | 2000 | 2000 |
| Bias Voltage (Volts D.C.) | 50 | 50 |
| Initial Pressure Chamber ($\times 10^{-7}$ Torr) | 2.4 | 2.4 |
| Chamber Pressure (millitorr) | 20 | 20 |
| Cathode Diameter (cm) | 10.16 | 10.16 |
| Time (min.) | 30 | 120 |
| Temperature (°C.) | cold $H_2O$ | cold $H_2O$ |
| Thickness of film (Å) | 32,000 | |
| Ohms/square | 1.56 | |
| $\rho$ ($\mu\Omega$ cm) | 512 | |
| Magnetization ($4\pi M_s$) | 10.4 | |
| $H_k{}^*$ | +1000 | |

Example XVI

| Target Content $Co_{78}Fe_5B_{17}$<br>Run Number 33 | Presputter | Sputter |
|---|---|---|
| Percent $N_2$: Percent Ar | 10:90 | 10:90 |
| Incident Watts (R.F.) | 90 | 90 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 0.81 | 0.81 |
| Chamber Pressure (millitorr) | 20 | 20 |
| Cathode Diameter (cm) | 11.43 | 11.43 |
| Time (min.) | 60 | 60 |
| Temperature (°C.) | cold $H_2O$ | cold $H_2O$ |
| Thickness of film (Å) | | 4850 |
| Ohms/square | | — |
| $\rho$ ($\mu\Omega$ cm) | | 976 |
| Magnetization ($4\pi M_s$) | | 7.9 |
| $H_k^*$ | | +900 |

Example XVII

| Target Content $Co_{78}Fe_5B_{17}$<br>Run Number 21 | Presputter | Sputter |
|---|---|---|
| Percent $N_2$: Percent Ar | 100:0 | 100:0 |
| Incident Watts (R.F.) | 85 | 85 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 1.2 | 1.2 |
| Chamber Pressure (militorr) | 20 | 20 |
| Cathode Diameter (cm) | 10.16 | 10.16 |
| Time (min.) | 30 | 60 |
| Temperature (°C.) | cold $H_2O$ | cold $H_2O$ |
| Thickness of film (Å) | | 26,200 |
| Ohms/square | | 11.05 |
| $\rho$ ($\mu\Omega$ cm) | | 1362 |
| Magnetization ($4\pi M_s$) | | — |
| $H_k^*$ | | 0 |

Example XVIII

| Target Content $Co_{78}Fe_5B_{17}$<br>Run Number 23 | Presputter | Sputter |
|---|---|---|
| Percent $N_2$: Percent Ar | 100:0 | 100:0 |
| Incident Watts (R.F.) | 120 | 120 |
| Reflected Watts | 0 | 0 |
| Cathode Voltage (D.C.) | 1000 | 1000 |
| Bias Voltage (Volts D.C.) | 100 | 100 |
| Initial Pressure Chamber ($\times 10^{-7}$ Torr) | 4.4 | 4.4 |
| Chamber Pressure (millitorr) | 20 | 20 |
| Cathode Diameter (cm) | 10.16 | 10.16 |
| Time (min.) | 30 | 60 |
| Temperature (°C.) | cold $H_2O$ | cold $H_2O$ |
| Thickness of film (Å) | | 1210 |
| Ohms/square | | 16 |
| $\rho$ ($\mu\Omega$ cm) | | 1295 |
| Magnetization ($4\pi M_s$) | | — |
| $H_k^*$ | | 0 |

Example XIX

| Target Content $Co_{78}Fe_5B_{17}$<br>Run Number 26 | Presputter | Sputter |
|---|---|---|
| Percent $N_2$: Percent Ar | 100:0 | 100:0 |
| Incident Watts (R.F.) | 95 | 95 |
| Reflected Watts | 0 | 0 |
| Cathode Voltage (D.C.) | 2000 | 2000 |
| Bias Voltage (Volts D.C.) | 50 | 50 |
| Initial Pressure Chamber ($\times 10^{-7}$ Torr) | 1.8 | 1.8 |
| Chamber Pressure (millitorr) | 20 | 20 |

-continued

| Target Content $Co_{78}Fe_5B_{17}$<br>Run Number 26 | Presputter | Sputter |
|---|---|---|
| Cathode Diameter (cm) | 10.16 | 10.16 |
| Time (min.) | 30 | 120 |
| Temperature (°C.) | cold $H_2O$ | cold $H_2O$ |
| Thickness of film (Å) | | 16,970 |
| Ohms/square | | 2.2 |
| $\rho$ ($\mu\Omega$ cm) | | 1338 |
| Magnetization ($4\pi M_s$) | | — |
| $H_k^*$ | | 0 |

Example XX

| Target Content $Fe_{80}B_{20}$<br>Run Number 14 | Presputter | Sputter |
|---|---|---|
| Percent $N_2$: Percent Ar | 0:100 | 0:100 |
| Incident Watts (R.F.) | 80 | 80 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 1.1 | 1.1 |
| Chamber Pressure (millitorr) | 20 | 20 |
| Cathode Diameter (cm) | 11.43 | 11.43 |
| Time (min.) | 30 | 60 |
| Temperature (°C.) | cold $H_2O$ | cold $H_2O$ |
| Thickness of film (Å) | | 3390 |
| Ohms/square | | 2.98 |
| $\rho$ ($\mu\Omega$ cm) | | 128 |
| Magnetization ($4\pi M_s$) | | 14.1 |
| $H_k^*$ | | +680 |
| Knoop | | ≃800DPN |

Example XXI

| Target Content $Fe_{80}B_{20}$<br>Run Number 16 | Presputter | Sputter |
|---|---|---|
| Percent $N_2$: Percent Ar | 10:90 | 10:90 |
| Incident Watts (R.F.) | 85 | 85 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 3.2 | 3.2 |
| Chamber Pressure (millitorr) | 20 | 20 |
| Cathode Diameter (cm) | 11.43 | 11.43 |
| Time (min.) | 30 | 60 |
| Temperature (°C.) | cold $H_2O$ | cold $H_2O$ |
| Thickness of film (Å) | | 5460 |
| Ohms/square | | 48.6 |
| $\rho$ ($\mu\Omega$ cm) | | 502 |
| Magnetization ($4\pi M_s$) | | 4.4 |
| $H_k^*$ | | +1200 |
| Knoop | | ≃1600DPN |

Example XXII

| Target Content $Fe_{80}B_{20}$<br>Run Number 15 | Presputter | Sputter |
|---|---|---|
| Percent $N_2$: Percent Ar | 100:0 | 100:0 |
| Incident Watts (R.F.) | 85 | 85 |
| Reflected Watts | 0 | 0 |
| Cathode Voltage (D.C.) | 1000 | 1000 |
| Bias Voltage (Volts D.C.) | 50 | 50 |
| Initial Pressure Chamber ($\times 10^{-7}$ Torr) | 1.6 | 1.6 |
| Chamber Pressure (millitorr) | 20 | 20 |
| Cathode Diameter (cm) | 11.43 | 11.43 |
| Time (min.) | 30 | 60 |
| Temperature (°C.) | cold $H_2O$ | cold $H_2O$ |
| Thickness of film (Å) | | 2520 |
| Ohms/square | | 17.5 |
| $\rho$ ($\mu\Omega$ cm) | | 1725 |
| Magnetization ($4\pi M_s$) | | 0 |

-continued

| Target Content Fe$_{80}$B$_{20}$ Run Number 15 | Presputter | Sputter |
|---|---|---|
| H$_k$* | | 0 |
| Knoop | | ≃2400DPN |

What is claimed is:

1. An amorphous metallic alloy film composed of nitrogen with at least one transition metal selected from the group consisting of Cr, Fe, Co, and Ni and with at least one element selected from the group consisting of B, Si, Al, C, and P, wherein the nitrogen content of said alloy is greater than about 1 atomic percent.

2. A film in accordance with claim 1 wherein said film comprises an alloy of (Co-Fe-B)N.

3. A film in accordance with claim 2 wherein said film comprises (Co$_{78}$Fe$_5$B$_{17}$)$_x$N$_{100-x}$ where $100-x$ is at least about 1% of x.

4. A film in accordance with claim 1 wherein said film comprises an alloy of (Fe-B)N.

5. A film in accordance with claim 4 wherein said film comprises an alloy of (Fe$_{80}$B$_{20}$)$_x$N$_{100-x}$ where $100-x$ is at least about 1% of x.

6. A film in accordance with claim 1 wherein said film is deposited upon a substrate and said film possesses an adhesion to said substrate exceeding a pull test in which a rigid object is secured to said film with an epoxy glue and the substrate and the rigid object are pulled to a force reaching the destruction limit of said substrate and said film contains on the order of 26 atomic percent of nitrogen.

7. A film in accordance with claim 1 wherein said film is deposited upon a substrate and said film possesses an adhesion to said substrate exceeding a peeling test with adhesive tape wherein said tape is applied to said film and pulled away from said substrate and said film contains about 14 to 26 atomic percent of nitrogen.

8. A film in accordance with claim 1 wherein said film possesses a hardness having an increase of 1 grade on the Moh's scale above the hardness of a comparable alloy excluding any nitrogen, and said film includes in the order of 20 atomic percent of nitrogen.

9. A film in accordance with claim 1 wherein said film has magnetic-thermal stability up to 400° C. and said film includes above about 9 atomic percent of nitrogen.

10. A film in accordance with claim 1 having corrosion resistance containing greater than about 10 atomic percent of an element selected from the group consisting of chromium and nitrogen wherein said nitrogen is in addition to said 1 atomic percent for a total greater than about 10 atomic percent.

11. A film in accordance with claim 1 having a substantial perpendicular anisotropy including more than about 1 atomic percent of nitrogen in the film.

12. A film in accordance with claim 1 wherein an alloy including one or more elements selected from the group of magnetic transition metals consisting of Fe, Ni and Co in substantial quantities sufficient to have a high magnetization in the absence of nitrogen in the film but which has substantially no magnetization when the atomic percent of nitrogen in the film is on the order of 20.

* * * * *